US007071850B1

(12) United States Patent
Fitzgibbon et al.

(10) Patent No.: US 7,071,850 B1
(45) Date of Patent: Jul. 4, 2006

(54) METHOD AND APPARATUS TO FACILITATE TRANSMISSION OF TERNARY MOVABLE BARRIER OPERATOR INFORMATION

(75) Inventors: James J. Fitzgibbon, Batavia, IL (US); Eric Gregori, Lindenhurst, IL (US)

(73) Assignee: The Chamberlain Group, Inc., Elmhurst, IL (US)

( * ) Notice: Subject to any disclaimer, the term of this patent is extended or adjusted under 35 U.S.C. 154(b) by 0 days.

(21) Appl. No.: 11/044,411

(22) Filed: Jan. 27, 2005

(51) Int. Cl.
*H03M 5/16* (2006.01)

(52) U.S. Cl. .......................... 341/57; 341/56; 341/173; 341/176; 340/5.31; 340/5.64; 340/5.7; 340/5.72; 340/5.73; 340/5.8; 340/5.85; 340/825.57; 340/825.69; 340/825.72

(58) Field of Classification Search ........... 340/825.69; 341/57, 176
See application file for complete search history.

(56) References Cited

U.S. PATENT DOCUMENTS 3,906,348 A * 9/1975 Willmott ............... 340/825.63
4,097,859 A * 6/1978 Looschen .................... 341/57
4,178,549 A * 12/1979 Ledenbach et al. ......... 375/238
4,243,976 A * 1/1981 Warner et al. ................ 341/57
4,468,787 A * 8/1984 Keiper, Jr. .................. 375/288
4,750,118 A * 6/1988 Heitschel et al. ............. 700/90
4,808,995 A * 2/1989 Clark et al. ................ 340/5.64
4,829,296 A * 5/1989 Clark et al. ................ 340/5.65
4,910,750 A * 3/1990 Fisher ........................ 375/292
4,988,992 A * 1/1991 Heitschel et al. ...... 340/825.69
5,136,548 A * 8/1992 Claar et al. .................... 367/2
5,442,340 A * 8/1995 Dykema ................ 340/825.22
5,576,701 A * 11/1996 Heitschel et al. .......... 340/5.31
5,578,999 A * 11/1996 Matsuzawa et al. ... 340/825.22
5,699,065 A * 12/1997 Murray ........................ 341/176
6,049,289 A * 4/2000 Waggamon et al. ....... 340/5.23
6,154,544 A * 11/2000 Farris et al. ................ 380/262
6,181,255 B1 * 1/2001 Crimmins et al. ..... 340/825.69
6,414,587 B1 * 7/2002 Fitzgibbon ................. 340/5.22

* cited by examiner

*Primary Examiner*—Rexford Barnie
*Assistant Examiner*—Khai M. Nguyen
(74) *Attorney, Agent, or Firm*—Fitch, Even, Tabin & Flannery

(57) ABSTRACT

Ternary data as corresponds to a movable barrier operator is provided (21) and converted (22) into corresponding binary information. In a preferred approach this comprises converting each ternary trit into a corresponding binary pair. Pursuant to a preferred approach binary bits as correspond to, for example, fixed and/or non-fixed information (32 and 33) are provided (31) and then converted (34) into the aforementioned ternary data.

19 Claims, 5 Drawing Sheets

METHOD AND APPARATUS TO FACILITATE TRANSMISSION OF TERNARY MOVABLE BARRIER OPERATOR INFORMATION

TECHNICAL FIELD

This invention relates generally to movable barrier operators and more particularly to the transmission of movable barrier operator information.

BACKGROUND

Movable barrier operators of various kinds are known in the art. These include operators that effect the selective control and movement of single panel and segmented garage doors, pivoting, rolling, and swinging gates, guard arms, rolling shutters, and various other movable barriers. In general, such movable barrier operators typically operate (at least in part) by responding to a remotely sourced control signal. For example, an individual in a vehicle can manipulate a corresponding wireless remote control device to transmit an OPEN command to a given movable barrier operator to thereby cause the latter to move a corresponding movable barrier towards an opened position. It is also known to effect communications between a movable barrier operator and various other elements such as, but not limited to, tethered and un-tethered control interfaces, displays, lighting modules, alarm systems, obstacle detectors, and so forth.

One known approach to supporting such communications makes use of ternary data. Whereas many data communications rely upon binary data, ternary data has been used for at least some movable barrier operator communications. It is not always readily convenient, however, to facilitate the transmission and reception of true ternary data (i.e., data that can have any of three different states). Such problems can arise, for example, when interfacing a movable barrier operator with a peripheral element that only communicates using standard serial hardware that relies upon binary signaling.

It is also known that encryption can be used to secure a given data transmission. Unfortunately, many encryption techniques are relatively expensive to deploy. This can be prohibitive when considering the use of encryption in a highly price sensitive context such as movable barrier operators and their peripherals.

BRIEF DESCRIPTION OF THE DRAWINGS

The above needs are at least partially met through provision of the method and apparatus to facilitate transmission of ternary movable barrier operator information described in the following detailed description, particularly when studied in conjunction with the drawings, wherein.

Skilled artisans will appreciate that elements in the figures are illustrated for simplicity and clarity and have not necessarily been drawn to scale. For example, the dimensions and/or relative positioning of some of the elements in the figures may be exaggerated relative to other elements to help to improve understanding of various embodiments of the present invention. Also, common but well-understood elements that are useful or necessary in a commercially feasible embodiment are often not depicted in order to facilitate a less obstructed view of these various embodiments of the present invention. It will also be understood that the terms and expressions used herein have the ordinary meaning as is accorded to such terms and expressions with respect to their corresponding respective areas of inquiry and study except where specific meanings have otherwise been set forth herein.

DETAILED DESCRIPTION

Generally speaking, pursuant to these various embodiments, ternary data as corresponds to a movable barrier operator is provided and converted into a binary format. The binary information is then transmitted to or from a movable barrier operator. As will be shown below in more detail, this process can achieve an encryption effect while also serving to ensure compatible use of binary peripheral platforms.

In a preferred approach, converting the ternary data to a binary format comprises mapping each trit of the ternary data to a corresponding pair of binary bits. A pair of binary bits can represent 4 discrete information elements and in a preferred approach, three of these discrete information elements each correspond to one of the three trit states/levels and the fourth discrete information element (which otherwise comprises an illegal value) serves a synchronization function.

So configured, different encoded ternary values in a given field can represent a particular corresponding size of bearer content as is being exchanged between a movable barrier operator and a given peripheral and/or the updating of rolling code information. The bearer content can comprise, for example, non-fixed information that corresponds in some way to the movable barrier operator. It is also possible, and actually preferred, to combine such non-fixed information with fixed information (such as, but not limited to, fixed information such as identifying information for the movable barrier operator and/or the peripheral platform).

It is also possible to combine one or more of the above data elements with rolling code bits (wherein the rolling code itself comprises the same rolling code as is otherwise used by the movable barrier operator to authenticate incoming communications and/or communication sources). In fact, and as will be disclosed below in more detail, the incorporation of rolling code information can serve an encryption function as well.

Figure 1:
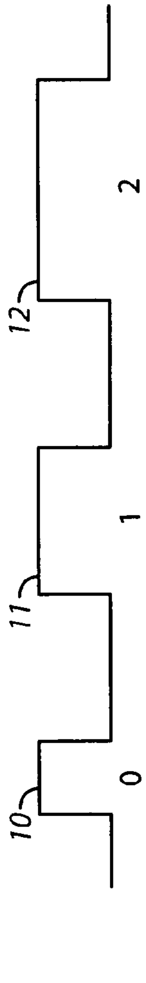
FIG. 1 (Prior Art)
FIG. 1 comprises a depiction of prior art ternary encoding.

These and other benefits may become clearer upon making a thorough review and study of the following detailed description. Referring now to the drawings, and in particular to FIG. 1, it may be helpful to first describe in more detail a typical ternary data protocol as one finds often deployed in conjunction with many movable barrier operators. Pursuant to the illustrated approach, pulses of similar amplitude have one of three different durations. For example, a first pulse 10, having a shortest duration, can represent the data element "0." A second pulse 11, having a medium length duration, can represent the data element or state "1." And a third pulse 12, having a longest duration, can represent the data element or state "2." Such a data mapping protocol serves well to effect a base three-based data exchange. As will be disclosed below in more detail, these teachings utilize and leverage a ternary approach to effect relatively secure and compatible communications between a movable barrier operators and corresponding peripheral components of choice. In general, however, these teachings eschew the specific ternary approach just described.

Figure 2:
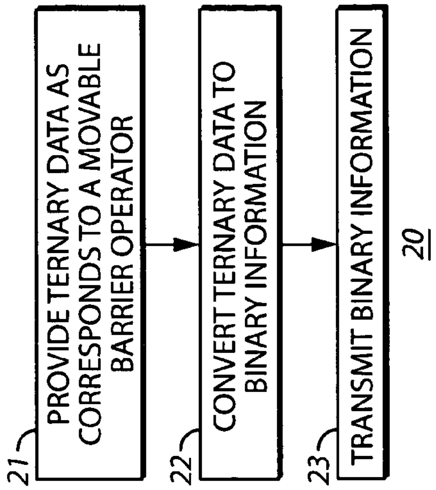
FIG. 2 comprises a flow diagram as configured in accordance with various embodiments of the invention.

Referring now to FIG. 2, in general, these teachings provide a process 20 that itself provides 21 ternary data as corresponds to a movable barrier operator and then converts 22 that ternary data to a binary format to provide resultant binary information. This binary information is then transmitted 23 from one platform to another. As will be shown below, this ternary-to-binary conversion process serves, at least in part, as a kind of encryption process which in turn aids in ensuring the authenticity and accuracy of the information being transmitted.

Figure 3:
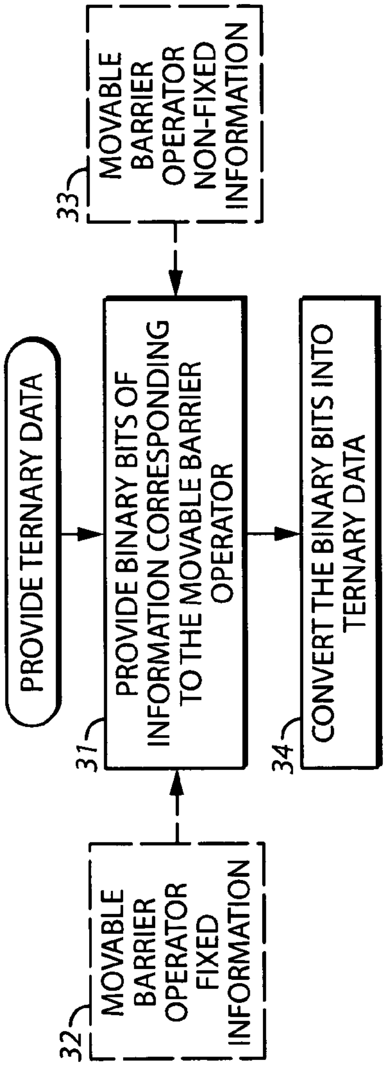
FIG. 3 comprises a flow diagram as configured in accordance with various embodiments of the invention.

The ternary data itself can comprise, at least in part, bearer data. More particularly, and referring momentarily to FIG. 3, pursuant to a preferred (though optional) approach, provision of ternary data can comprise prior provision 31 of binary bits comprising information that corresponds to the movable barrier operator (for example, information sourced by, or intended for, a movable barrier operator). Such information can optionally comprise, for example, movable barrier operator fixed information 32 such as identifying information for a particular movable barrier operator, a particular peripheral component, or the like. Such information can also optionally comprise (in addition to or in lieu of fixed information 32) non-fixed information 33 as again corresponds to the movable barrier operator. This non-fixed information 33 can comprise bearer data/information (such as, but not limited to, platform status information, commands, acknowledgments, and so forth). As will be shown below, this non-fixed information 33 can also comprise varying quantities of data if desired.

These binary bits are then preferably converted 34 into the aforementioned ternary data. This could comprise, in an appropriate platform, a conversion of the binary data into ternary data such as that described above with respect to FIG. 1. In general, such an approach need not be used. Instead, the binary data can be converted into a binary-bit-based ternary format (with an illustrative example being provided further below).

Figure 4:
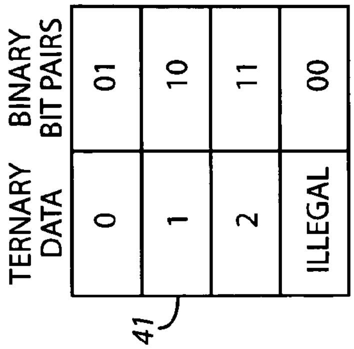
FIG. 4 comprises a mapping table as configured in accordance with various embodiments of the invention.

As mentioned above, these teachings contemplate converting such ternary data into binary information. In a preferred approach, however, this does not comprise a simple reversal of the binary-to-ternary process just described. Instead, the ternary-to-binary conversion step comprises, in a preferred approach, mapping each trit of the ternary data to a corresponding pair of binary bits. To illustrate, and referring momentarily to FIG. 4, the ternary data element "0" (which corresponds to the usual binary data element "0") maps to the binary pair "01." In similar fashion, ternary "1" (which corresponds to usual binary "1") maps to the binary pair "10" and ternary "2" (which corresponds to usual binary "11") maps to the binary pair "11."

This leaves an otherwise unused binary pair "00." Pursuant to a preferred approach, this otherwise illegal value can serve a synchronization function when facilitating communications as between a movable barrier operator and one or more peripheral components when using a binary format that otherwise has no synchronization mechanism built into its format (for example, a stream of binary bits such as:

0110111111101001110111011011111110100111011101101111111010011101111 which format lacks a frame marker or other point of synchronization). To illustrate, a synchronization signal/marker comprising this "00" binary pair can be used to indicate, for example, the regular end and/or start of a frame or message as in the following example:

00011011111101001011101100011011111110100111011100110110111111010011 where the bold font "00" regularly spaced binary pairs serve as frame markers (and which, due to their synchronized regular spacing, are readily distinguishable from other "00" pairs as may occur for whatever reason (illustratively depicted in the above example with italic font).

Those skilled in the art will appreciate that this process of converting binary information into ternary information, followed by conversion of that ternary information into corresponding binary pairs, yields, in most cases, a different bit sequence (and even a different number of bits) as compared to the initial binary information. This difference serves, at least in part, a non-key-based encryption technique and thereby provides an added element of security with respect to the data being transmitted.

Figure 5:
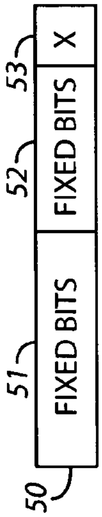
FIG. 5 comprises a schematic view of a data frame as configured in accordance with various embodiments of the invention.

As mentioned above, and as will be described in more detail below, message payloads of differing sizes can be accommodated by these teachings. Pursuant to a preferred approach, for example, at least two differently sized payloads can be accommodated. It is helpful, however, to provide a specific indication in a conveyed message regarding which sized payload is being conveyed. By one preferred approach, and referring now to FIG. 5, a frame 50 of otherwise fixed data comprising, in this illustrative example, a first field 51 of fixed bits and a second field 52 of fixed bits (where these fixed bits correspond, for example, to non-changing information such as source and/or target identifying information) also comprises a ternary value "X" 53 (preferably comprising a corresponding binary pair as per the above-described mapping convention).

A first particular ternary value 53 can correspond to and otherwise indicate provision of bearer content having a first size while a second particular ternary value 53 can correspond to and otherwise indicate provision of bearer content having a second, different size. For example, the second value can indicate a smaller sized bearer content than does the first value. The third possible ternary state/value can correspond to a third size of bearer content if desired. In a preferred approach, however, and as will be described below in more detail, the third available ternary level can be used to identify a rolling code update (for the rolling code that is otherwise employed by the movable barrier operator in ordinary course of operation).

So configured, ternary data as ordinarily employed by and with a movable barrier operator can be supported in a binary context, thereby effecting compatible operation with non-ternary signal paths and/or peripheral platforms. The ternary nature of the source data can also be leveraged to aid in characterizing a given communication with respect to the size and/or nature of its payload and/or to facilitate other systems-related overhead such as synchronization. In addition, the processes set forth, as a beneficial side effect, can contribute to the security of the resultant transmissions. This security can be enhanced through appropriate data manipulation and also through incorporation of the rolling code mechanism as is typically employed by the movable barrier operator to authenticate incoming signal sources.

Figure 6:
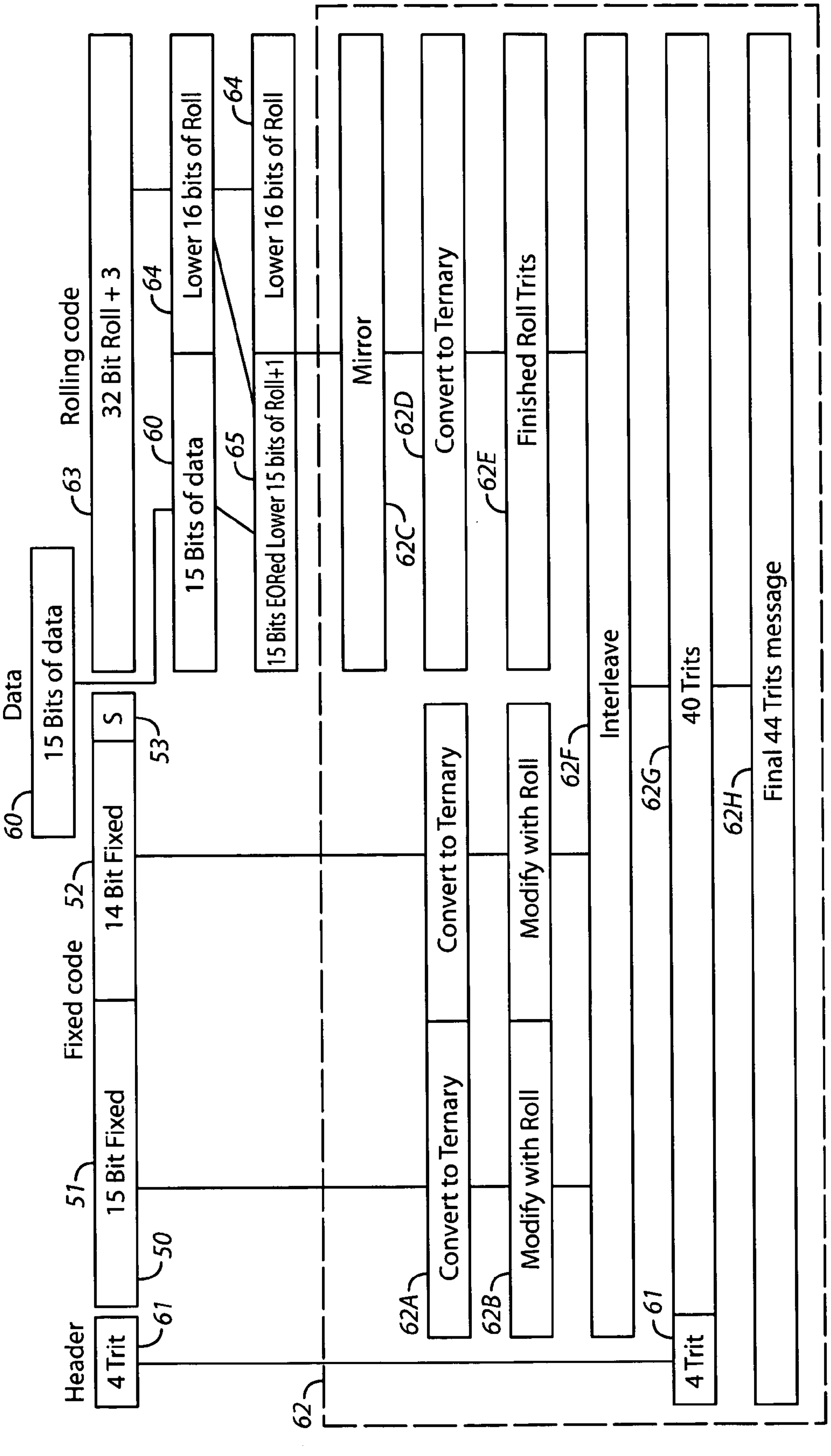
FIG. 6 comprises a comprises a data frame flow diagram as configured in accordance with various embodiments of the invention.

Referring now to FIG. 6, some specific exemplary illustrative examples will now be provided.

In this first illustrative example, a peripheral component (such as, but not limited to, an intrusion-detection alarm system) has a 15 (binary) bit payload 60 to communicate to a movable barrier operator. This payload comprises, in this example, non-fixed data that can and will vary in content with need and circumstance.

A framing/source/direction header 61 comprises 4 trits of data (since the participating platform is, likely by definition, a non-ternary-based platform, these trits each preferably comprise a binary pair counterpart as per the mapping convention disclosed above.

A fixed code frame 50 as disclosed above (comprising, in this example, a 15 bit fixed code field, a 14 bit fixed code field, and a characterizing 1 trit field 53) serves to contain, in this example, a fixed identifier for the peripheral component itself (such as a manufacturer or installer assigned identifier code) that aids the movable barrier operator in identifying the peripheral component and distinguishing its communications from those of other devices and sources.

In this example, the characterizing 1 trit field 53 has a trit value of "0" which signifies, in this example, the 15 bit size of the data payload 60 described above. This field, upon receipt, can aid the movable barrier operator with respect to recovering that payload 60.

The contents of the header 61 and fixed code frame 50 are manipulated and processed pursuant to a back-end process 62 described below. First, however, it may be beneficial to first describe a front-end data manipulation process as corresponds to the data payload 60 itself.

The present 32 bit (in this example) rolling code value as used by the movable barrier operator in incremented by a value of "3" to provided an incremented rolling code value 63. In many instances the peripheral component will already have a correct (or otherwise usable) rolling code value by means well understood in the art and requiring no further elaboration here. In other cases, where substantial rolling code synchronization has been lost for whatever reason, the peripheral device can receive an update as pertains to the rolling code from, for example, the movable barrier itself (a technique for effecting such an update as per these teachings is set forth further below in this description).

The 15 bits of the data payload 60 are then combined through concatenation with the lower 16 bits 64 (i.e., the least significant bits) of the incremented rolling code value 63. The 15 bits of the data payload 60 are then exclusive ORed with 15 bits of the lower 16 bits 64 and the resultant value then incremented by "1" to yield a 15 bit exclusive ORed result 65. In this exemplary approach, this completes the front-end data manipulation process that prepares the payload data 60 for the manipulations of the back-end process 62.

Turning now to that back-end process 62, the exclusive ORed result 65 is inverted or mirrored with respect to the lower 16 bits of the incremented rolling code 64 to provide a reverse ordered series of bits 62C. These binary bits are then converted to a ternary form 62D (i.e., from a base two representation to a base three representation). For example, by way of illustration, the value "9" (in base ten) would appear in binary format as "1001." This number in binary, once converted to ternary form, would appear as "100." In general, however, the peripheral component will not be able to literally calculate or process using a ternary data system. Therefore, in a preferred approach, these ternary trits are each mapped to a corresponding binary pair as described above to provide binary pair encoded trits 62E. To complete this example, then, the original ternary value "100" would be expressed as the three binary pairs "10 01 01." It may therefore be seen that the original binary value "1001" is converted into the binary expression "100101."

Those skilled in the art will understand and appreciate that this conversion process therefore provides a supplemental benefit of effectively encrypting the original binary expression as a coded expression. It will further be appreciated that incorporation of the rolling code value as described above adds a further element of variability and hence further serves a kind of encryption purpose as well (with the exclusive ORing, concatenation, and reverse bit ordering also contributing at least in part to the encoded/encrypted result).

Referring again to the fixed code frame 50 described above, the binary data as comprise the fixed code frame 50 are similarly converted to a ternary system and in particular are converted to corresponding binary pair encoded trits 62A. These binary pair encoded trits 62A as comprise the aforementioned fixed code information are then modified in conjunction with the binary pair encoded trits 62E as represent the rolling code modified non-fixed code information.

The precise nature of this modification can vary with the needs of a given setting and/or the preferences of the designer. Pursuant to one approach, this modification comprises combining the trits, on a trit by trit basis, of the binary pair encoded trits 62A as represent the non-fixed code information with the binary pair encoded trits 62E as represent the fixed code information and then retaining the least significant bit of the resultant combination. For example, the $20^{th}$ bit of the fixed code information is added to the $20^{th}$ bit of the non-fixed code information and the least significant bit of the resulting sum is then retained as the modified result 62B. Preferably this modification occurs with respect to both the 15 bit fixed code field information 51 and the 14 bit fixed code field information 52 (in combination with the characterizing field 53).

The resultant fixed code information modified binary pair encoded trits 62B are then interleaved with the non-fixed code information modified binary pair encoded trits 62E to provide a set of 40 binary pair encoded interleaved trits 62G. These are then preferably combined with the original header 61 to provide a resultant message 62H that comprises, in this example, 44 trits that are encoded as 44 binary pairs (i.e., 88 binary bits).

Figure 7:
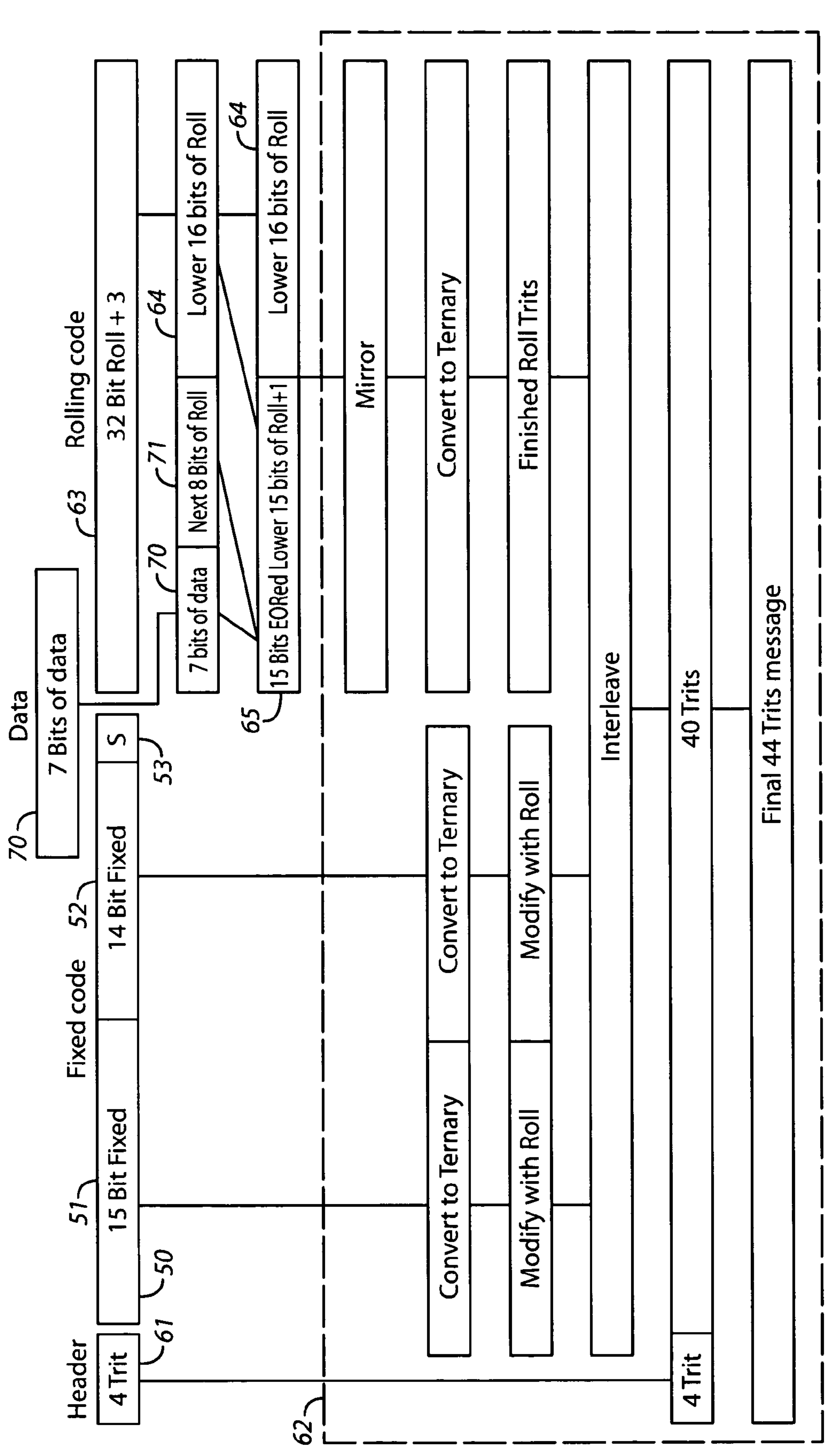
FIG. 7 comprises a data frame flow diagram as configured in accordance with various embodiments of the invention.

The above process permits up to 15 bits of non-fixed data to be encoded and communicated to or from a movable barrier operator using familiar concepts, strengths, and resources (such as ternary data and rolling code maintenance and usage) of the movable barrier operator. Referring now to FIG. 7, if desired, a reduced data capacity can also be accommodated. In the example, shown, the non-fixed code field 70 will accommodate 7 bits of data. Here, during the front-end processing of the non-fixed information, these 7 bits of non-fixed code 70 are effectively padded with a next 8 bits of the incremented-by-3 rolling code value 63 (that is, the next 8 bits as follow the first 16 bits 64 as were already applied for concatenation to the non-fixed code 70 information). The resultant 15 bits are then again exclusive ORed with the lower 16 bits of the incremented rolling code value 64 and concatenated with "1" as described above. The back-end process 62 than executes as described above.

If desired, the characterizing trit 53 in the fixed code information 50 can have a value or state that corresponds to and indicates that the non-fixed code size comprises the 7 bit quantity rather than the 15 bit quantity provided above with respect to FIG. 6. This in turn will permit a receiving platform to ascertain whether the resultant message contains 7 bits of non-fixed information or 15 bits of non-fixed information and hence whether to reverse the front-end process as corresponding to the one or the other.

These described processes presume that the encoding platform has an accurate value for the present rolling code. It is possible, for a variety of reasons, that this may not always be the case. In some cases the source platform may be able to independently ascertain that its present value for the rolling code is unsynchronized or otherwise inaccurate. In other cases, the source platform may be able to deduce this situation upon having its message rejected by the receiving platform. In such a case it may be helpful and/or desirable to provide a mechanism whereby a platform can be provided with an updated rolling code value to thereby re-establish its rolling code synchronicity.

Figure 8:
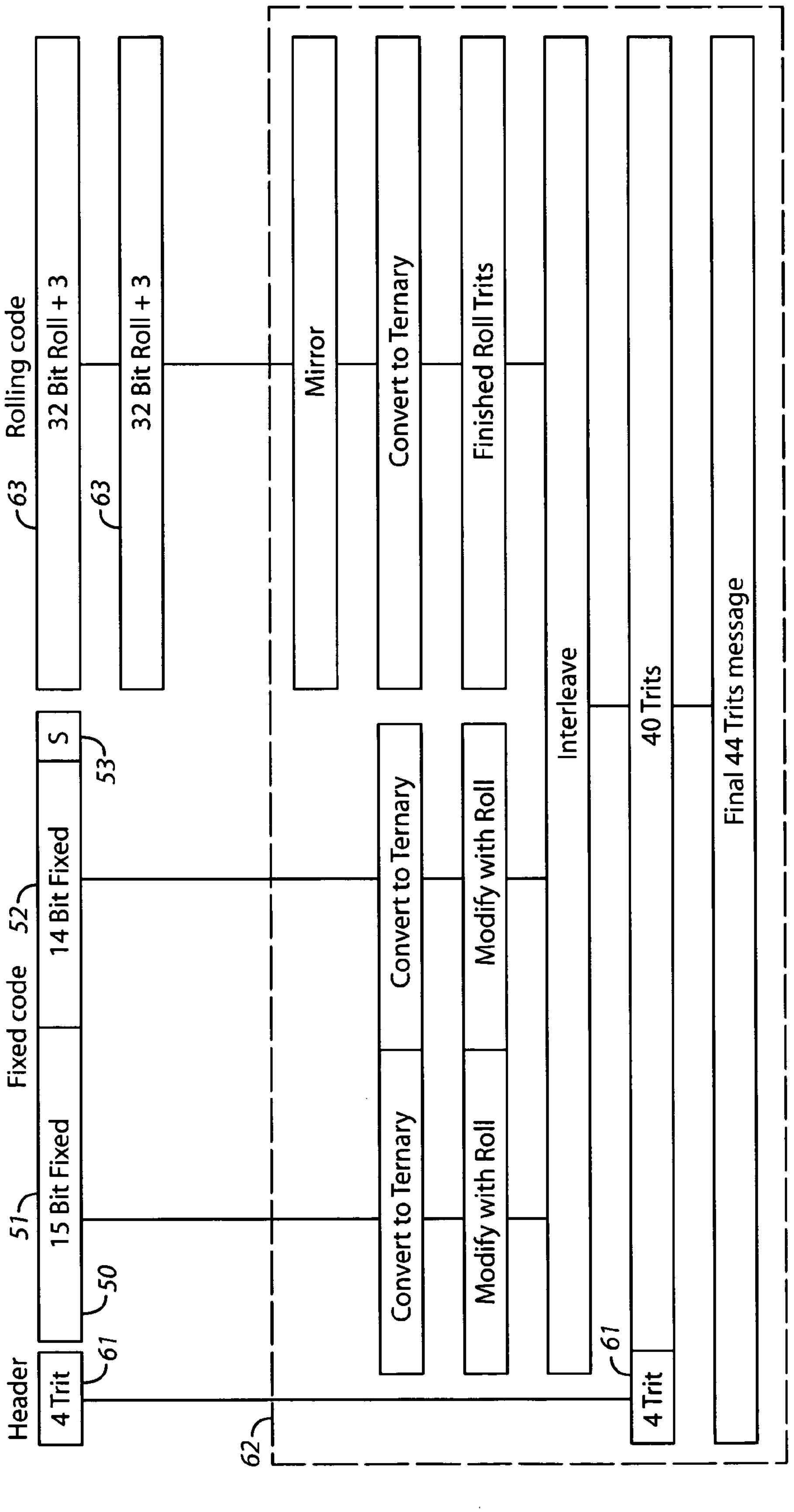
FIG. 8 comprises a data frame flow diagram as configured in accordance with various embodiments of the invention.

Referring now to FIG. 8, the above described processes can be modified to accommodate a message that essentially serves to transmit a present rolling code value. Pursuant to this approach, a present rolling code value 63 (incremented again by the value "3" in this illustrative embodiment) is submitted to the above described back-end process without prior combination with any user data. The characterizing field 53 can again be set to a value, this time a value indicating that the resultant message comprises the rolling code value (incremented by "3") and does not contain other non-fixed code information.

Figure 9:
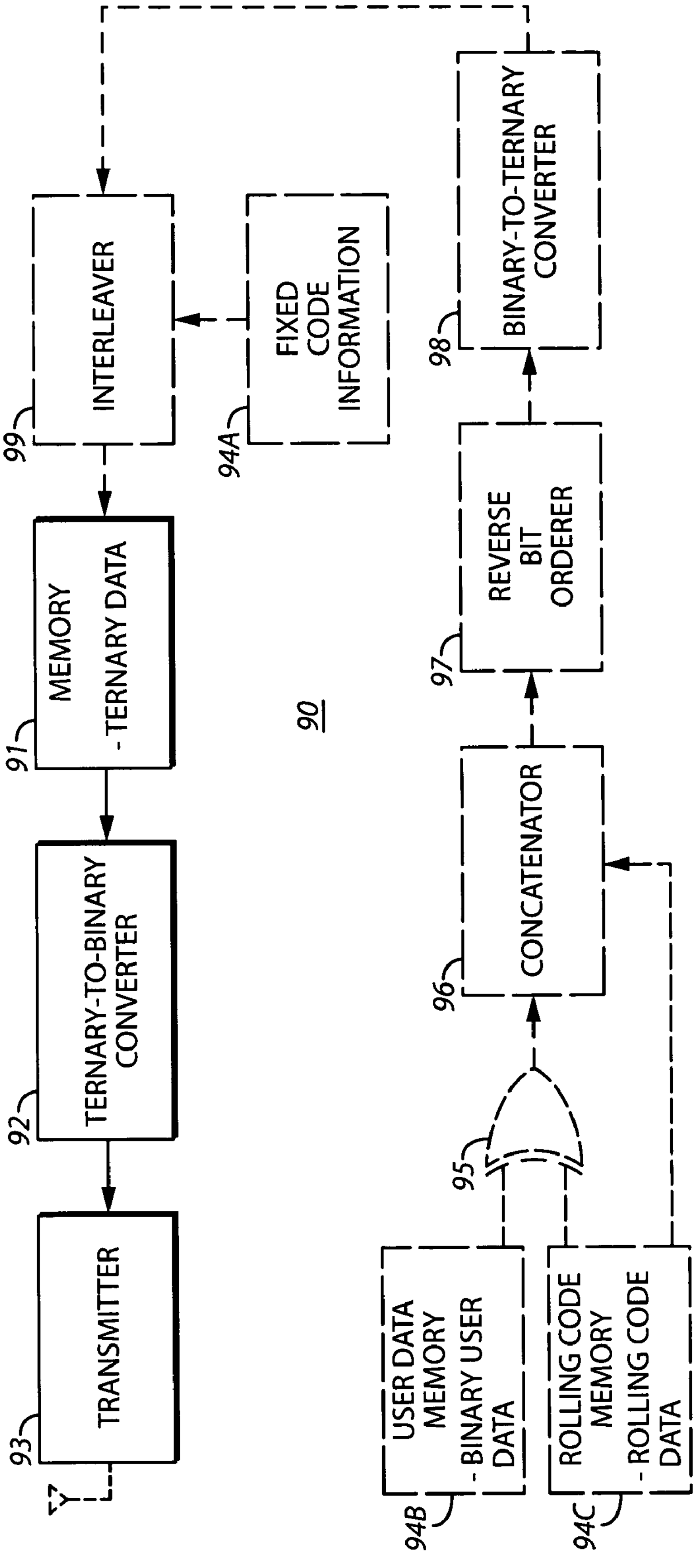
FIG. 9 comprises a block diagram as configured in accordance with various embodiments of the invention.

The above described processes are suitable for implementation via any number of presently known platforms and no doubt other platforms as will be developed hereafter. Generally speaking, and referring now to FIG. 9, a suitable enabling apparatus 90 (such as, but not limited to, a movable barrier operator or a device that communicates with a movable barrier operator) preferably has at least a first memory 91 containing the ternary data that is to be transmitted as between a movable barrier operator and a peripheral device. A ternary-to-binary converter 92 is operably coupled to this first memory 91 and serves to convert the ternary data into corresponding binary data.

More particularly, and pursuant to a preferred approach as set forth above, the ternary data comprises a binary expression of ternary data which the ternary-to-binary converter 92 then converts to corresponding binary pairs. A transmitter 93 receives this converted information and transmits the information to a given recipient (those skilled in the art will recognize that this transmitter 93 can use a wired/cabled pathway (such as an electrical conductor or an optical fiber) or a wireless pathway (such a radio frequency carrier, a freespace optical carrier, an ultrasonic carrier, and so forth).

The ternary data contained in the first memory 91 can be sourced in various ways. One optional but preferred approach begins, in part, with provision of a user data memory 94B that contain non-fixed binary user data and a rolling code memory 94C having rolling code data stored therein (such as a present rolling code value as incremented by "3"). Data from these two memories 94B and 94C are input to an exclusive OR 95 which provides its output to a concatenator 96. This concatenator 96 also operably couples to receive, in this illustrative embodiment, rolling code data from the rolling code memory 94C. So configured, the concatenator 96 serves to concatenate the output of the exclusive OR 95 with rolling code data.

A reverse bit orderer 97 operably couples to the concatenator 96 and serves to reverse order the concatenated output of the concatenator 96. The output of the reverse bit orderer 97 then operably couples to a binary-to-ternary converter 98 which serves to convert the binary data to binary-expressed ternary data as described above.

In this depicted embodiment an interleaver 99 couples to the binary-to-ternary converter 98 and a source of fixed code information 94A and interleaves the incoming data streams from these two sources (if desired, the fixed code information can be developed as described above). The interleaved data output of the interleaver 99 then couples to the first memory 91. So configured and arranged, the interleaved data from the interleaver 99 can comprise the ternary data that is then provided by the first memory 91 to the ternary-to-binary converter 92 described above.

So configured, the native capability of a movable barrier operator to process ternary data, along with the maintenance and use of a rolling code, is effectively leveraged and utilized to facilitate relatively secure communications as between such a movable barrier operator and one or more peripheral components/devices. Those skilled in the art will recognize that the blocks described above can be implemented using corresponding discrete physical elements and/or through us of a partially or wholly programmable platform. As many movable barrier operators comprise a programmable controller, in many instances it will likely be preferred to simply program the controller in accordance with the teachings.

Those skilled in the art will recognize that a wide variety of modifications, alterations, and combinations can be made with respect to the above described embodiments without departing from the spirit and scope of the invention, and that such modifications, alterations, and combinations are to be viewed as being within the ambit of the inventive concept.

We claim:

1. A method comprising:

providing ternary data as corresponds to a movable barrier operator;

converting the ternary data to a binary format to provide binary information, wherein converting the ternary data to a binary format further comprises mapping each trit of the ternary data to a corresponding pair of binary bits;

transmitting the binary information, wherein transmitting the binary information further comprises transmitting pairs of binary bits, wherein each of the pairs of binary bits potentially represents one of:

a particular ternary value;

an illegal value, wherein the illegal value serves a synchronization function.

2. The method of claim 1 wherein:

a first particular ternary value for the particular ternary value corresponds to bearer content having a first size;

a second particular ternary value for the particular ternary value corresponds to bearer content having a second size, which second size is different than the first size;

a third particular ternary value for the particular ternary value corresponds to updating a rolling code as is employed by the movable barrier operator.

3. A method comprising:

providing ternary data as corresponds to a movable barrier operator, wherein providing ternary data further comprises:

providing binary bits comprising information corresponding to the movable barrier operator wherein providing binary bits comprising information corresponding to the movable barrier operator further comprises providing binary bits as correspond, at least in part, to fixed information corresponding to the movable barrier operator wherein the fixed information comprises identifying information, wherein providing binary bits as comprising information corresponding to the movable barrier operator further comprises providing binary bits as correspond, at least in part, to non-fixed information corresponding to the movable barrier operator;
converting the binary bits into the ternary data;
converting the ternary data to a binary format to provide binary information; and
wirelessly transmitting the binary information.

4. A method comprising:
providing ternary data as corresponds to a movable barrier operator, wherein providing ternary data further comprises:
providing binary bits comprising information corresponding to the movable barrier operator,
converting the binary bits into the ternary data, and
combining at least some of the binary bits with rolling code bits;
converting the ternary data to a binary format to provide binary information;
transmitting the binary information.

5. The method of claim 4 wherein combining at least some of the binary bits with rolling code bits further comprises:
exclusive ORing the binary bits with the rolling code bits to provide encrypted bits;
concatenating the encrypted bits with the rolling code bits to provide resultant bits;
reverse ordering the resultant bits to provide reverse ordered bits;
and wherein converting the binary bits into the ternary data further comprises:
converting the reverse ordered bits into the ternary data.

6. The method of claim 5 and further comprising:
interleaving the ternary data with other ternary data prior to provide interleaved ternary data;
and wherein converting the ternary data to a binary format to provide binary information further comprises:
converting the interleaved ternary data to the binary format to provide the binary information.

7. The method of claim 6 wherein interleaving the ternary data with other ternary data further comprises:
providing additional binary bits comprising information corresponding to the movable barrier operator;
converting the additional binary bits comprising information corresponding to the movable barrier operator into intermediate ternary data;
modifying the intermediate ternary data using rolling code information to provide the other ternary data.

8. The method of claim 7 wherein modifying the intermediate ternary data using rolling code information further comprises:
modifying the intermediate ternary data using the ternary data.

9. The method of claim 8 wherein modifying the intermediate ternary data using the ternary data further comprises:
combining each trit of the intermediate ternary data with a corresponding trit of the ternary data to provide a resultant multi-trit value;
selecting a particular trit of each resultant multi-trit value to comprise the other ternary data.

10. The method of claim 9 wherein selecting a particular trit of each resultant multi-trit value further comprises selecting a least significant trit of each resultant multi-trit value.

11. A method of facilitating a communication as between a movable barrier operator and a peripheral device, comprising:
providing data to be transmitted, wherein the data comprises, at least in part, ternary data;
encrypting the data, at least in part, by converting at least some of the ternary data into corresponding binary data;
wirelessly transmitting the corresponding binary data.

12. The method of claim 11 wherein encrypting the data further comprises converting at least some trits as comprise the ternary data into corresponding binary pairs, such that each so-converted trit is represented by a corresponding binary pair.

13. A method of facilitating a communication as between a movable barrier operator and a peripheral device, comprising:
providing data to be transmitted, wherein the data comprises at least in part, ternary data;
providing initial data to be transmitted, wherein the initial data comprises, at least in part, initial binary data;
providing rolling code bits;
exclusive ORing at least some bits of the initial binary data with at least some of the rolling code bits to provide a resultant set of bits;
reverse ordering the resultant set of bits to provide reverse ordered bits;
converting the reverse ordered bits into corresponding ternary data to provide the ternary data;
encrypting the data, at least in part, by converting at least some of the ternary data into corresponding binary data; and
transmitting the corresponding binary data.

14. The method of claim 13 wherein providing initial data to be transmitted, wherein the initial data comprises, at least in part, initial binary data further comprises providing initial data that selectively comprises either of 15 binary bits and 7 binary bits.

15. An apparatus comprising at least one of a movable barrier operator and a device that communicates with a movable barrier operator, comprising:
a first memory having ternary data to be transmitted as between the movable barrier operator and the device that communicates with a movable barrier operator;
a ternary-to-binary converter being operably coupled to the first memory and having a binary data output;
a transmitter operably coupled to the binary data output.

16. An apparatus comprising at least one of a movable barrier operator and a device that communicates with a movable barrier operator, comprising:
a first memory having ternary data to be transmitted as between the movable barrier operator and the device that communicates with a movable barrier operator;
a ternary-to-binary converter being operably coupled to the first memory and having a binary data output;
a transmitter operably coupled to the binary data output;
a user data memory having binary user data stored therein;
a rolling code memory having rolling code data stored therein;
an exclusive OR having inputs operably coupled to the user data memory and the rolling code memory;
a concatenator being operably coupled to an output of the exclusive OR and the rolling code memory;
a reverse bit orderer being operably coupled to an output of the concatenator;

a binary-to-ternary converter having an input operably coupled to an output of the reverse bit orderer and having an output operably coupled to an input of the first memory.

17. The apparatus of claim 16 wherein the binary data output of the ternary-to-binary converter comprises a binary pair data output.

18. The apparatus of claim 17 wherein the ternary-to-binary converter comprises means for converting at least some trits of the ternary data into corresponding binary pairs, such that each such trit is represented by one corresponding binary pair.

19. The apparatus of claim 16 and further comprising interleaving means for interleaving trits as output from the binary-to-ternary converter with fixed code information as corresponds to the apparatus to provide trits as are input to the ternary-to-binary converter.

* * * * *